US008610289B2

(12) United States Patent
Wildpanner et al.

(10) Patent No.: US 8,610,289 B2
(45) Date of Patent: Dec. 17, 2013

(54) SEMICONDUCTOR COMPONENT AND METHOD FOR PRODUCING A METAL-SEMICONDUCTOR CONTACT

(75) Inventors: Bernd Wildpanner, Dresden (DE); Hilmar Von Campe, Bad Homburg (DE); Werner Buss, Hanau (DE)

(73) Assignee: Schott Solar AG, Mainz (DE)

( * ) Notice: Subject to any disclaimer, the term of this patent is extended or adjusted under 35 U.S.C. 154(b) by 490 days.

(21) Appl. No.: 12/137,590

(22) Filed: Jun. 12, 2008

(65) Prior Publication Data

US 2008/0308892 A1  Dec. 18, 2008

(30) Foreign Application Priority Data

Jun. 13, 2007  (DE) .......................... 10 2007 027 263

(51) Int. Cl.
| | |
|---|---|
| *H01L 23/48* | (2006.01) |
| *H01L 23/52* | (2006.01) |
| *H01L 29/40* | (2006.01) |
| *H01L 21/00* | (2006.01) |
| *H01L 31/00* | (2006.01) |
| *H01R 3/00* | (2006.01) |

(52) U.S. Cl.
USPC .......... 257/779; 257/449; 257/453; 257/454; 257/764; 257/E21.591; 438/98; 428/646; 439/500; 136/256

(58) Field of Classification Search
USPC ................................ 257/453, 449
See application file for complete search history.

(56) References Cited

U.S. PATENT DOCUMENTS

| | | | | |
|---|---|---|---|---|
| 3,453,501 | A | * | 7/1969 | Dunkle .......................... 257/762 |
| 4,293,451 | A | | 10/1981 | Bernd | |
| 4,336,648 | A | | 6/1982 | Pschunder et al. | |

(Continued)

FOREIGN PATENT DOCUMENTS

| | | |
|---|---|---|
| DE | 2945450 | 5/1981 |
| DE | 2945450 A1 | 5/1981 |

(Continued)

OTHER PUBLICATIONS

Rollert et al. in "Solubility, diffusion and thermodynamic properties of siliver in silicon", 1987, J. Phys. D: Appl. Phys. 20 1148-1155.*

(Continued)

*Primary Examiner* — Michael Jung
(74) *Attorney, Agent, or Firm* — Ladas & Parry LLP

(57) ABSTRACT

A semiconductor component including a first layer (10) of a semiconductor material as a substrate, a second layer (12) running on said first layer (10), and at least two intermediate layers (14, 16) made of the materials of the first and second layers running between the first and second layer, where the first intermediate layer (16) facing the second layer (12) may contain a eutectic mixture (18) made of the materials of the first and second layers. The invention is also directed to an electroconductive contact (15, 15a, 15b) forming an electroconductive connection to the first layer and originating at or running through the second layer, as well as to a method for producing the metal-semiconductor contact. In order to produce a mechanically durable, electrically flawless, removable contact in the area of the material of the second layer it is proposed that the electroconductive contact (15, 15a, 15b) include a solderable or wettable metallic material, which is alloyed into the second layer (12) or which forms a mixture with the material of the second layer.

56 Claims, 5 Drawing Sheets

(56) References Cited

U.S. PATENT DOCUMENTS

| | | | |
|---|---|---|---|
| 4,392,010 A | 7/1983 | Lindmayer | |
| 4,492,812 A | 1/1985 | Lindmayer | |
| 6,069,065 A | 5/2000 | Arimoto et al. | |
| 6,710,239 B2 * | 3/2004 | Tanaka | 136/244 |
| 2007/0128761 A1 * | 6/2007 | Owada et al. | 438/98 |
| 2007/0215202 A1 * | 9/2007 | Salami et al. | 136/256 |

FOREIGN PATENT DOCUMENTS

| | | |
|---|---|---|
| DE | 19752413 A1 | 12/1998 |
| EP | 0538840 A2 | 4/1993 |
| EP | 0729189 | 8/1996 |
| EP | 0729189 A1 | 8/1996 |
| GB | 2062351 | 5/1981 |
| GB | 1018848 | 2/1996 |
| JP | 5326990 | 3/1978 |
| JP | 62205668 | 9/1987 |
| JP | 10335267 | 12/1998 |
| JP | 2004179334 A | 6/2004 |
| JP | 2005217131 A | 8/2005 |
| JP | 2005326990 | 11/2005 |
| JP | 200641309 | 2/2006 |
| JP | 2006302891 A | 11/2006 |
| JP | 2007201007 A | 8/2007 |
| WO | 8302200 | 6/1983 |
| WO | 0141221 | 6/2001 |
| WO | 2006132766 | 12/2006 |
| WO | 2006132766 A2 | 12/2006 |

OTHER PUBLICATIONS

Peterson et al. in "Impurity Diffusion in Aluminum", 1970, Phys. Rev. B vol. 1. No. 8, 3264-3273.*

Lim et al., Assessment of the Al-Ag Binary Phase Diagram, 1995, Pergamon, Calphad vol. 19, No. 2, pp. 131-141.*

Murray, J.L. et al. in "The Al-Si (Aluminum-Silicon) System", 1984, Bulletin of Alloy Phase Diagrams, vol. 5, No. 1, pp. 74-84.*

Patent Abstracts of Japan English abstract of JP 2004-179334 A.

Patent Abstracts of Japan English abstract of JP 62-205668 A, Publication year 1987.

Espacent English abstract of JP 2006-302891 A.

Espacent English abstract of JP 2006-41309 A.

Espacent English abstract of JP 2005-217131 A.

Espacent English abstract of JP 2007-201007 A.

European Search Report dated Jan. 17, 2013 for Application No. EP12 19 1953.

* cited by examiner

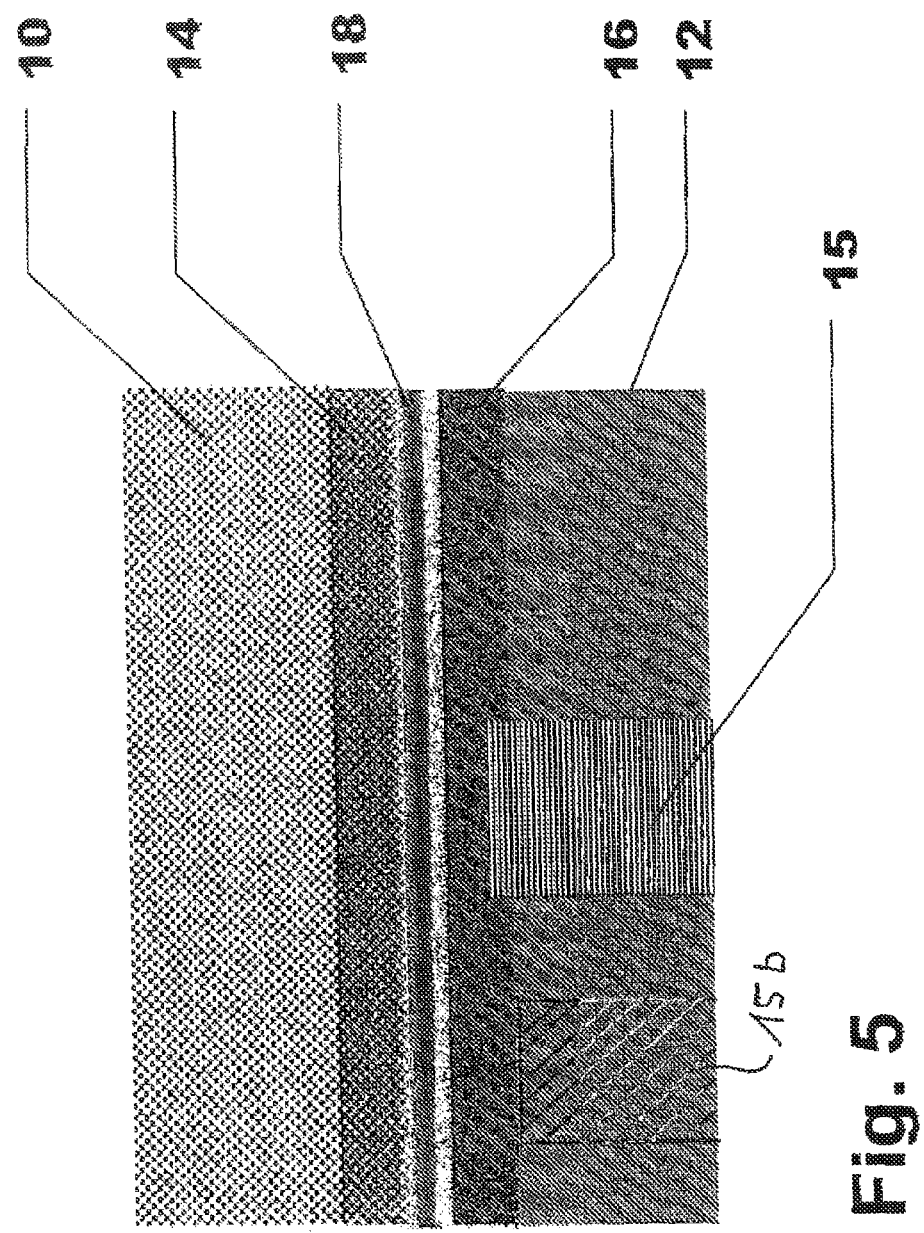

SEMICONDUCTOR COMPONENT AND METHOD FOR PRODUCING A METAL-SEMICONDUCTOR CONTACT

BACKGROUND OF THE INVENTION

1. Field of the Invention

The present invention relates to a semiconductor component comprising a first layer consisting of semiconductor material as a substrate, a second layer running on this first layer, at least a first and a second intermediate layer made of the materials of the first and second layers running between the first and second layers, as well as an electroconductive contact that forms a connection to the first layer and originates at the second layer or runs through the second layer.

Further, the present invention relates to a method for producing a metal-semiconductor contact of a semiconductor component, such as a solar cell, comprising a first layer as a substrate made of semiconductor material as well as a second layer applied to it made of basic contact material consisting of or containing metal.

2. Description of Related Art

In the production of semiconductors, in particular in the production of solar cells, sintered metal contacts are used for the front and back surfaces of the cell for production costs reasons.

A silicon solar cell usually has a large-area aluminum layer on the back surface, which is exposed to a sintering process by means of thermal treatment during production of the solar cell, as a result of which the back surface of the solar cell is simultaneously passivated by means of a so-called back-surface field (BSF).

On sintering, the aluminum layer, which is in direct contact with the silicon substrate that should be designated as the first layer, is melted at the boundary layer between the aluminum layer and the silicon substrate and alloyed with the adjacent first layer. On cooling, the highly Al doped silicon layer solidifies epitactically on the back surface of the wafer facing the silicon, namely the substrate. Simultaneously, a silicon enriched Al layer solidifies on the side facing the Al layer, and at the end of the cooling process, an Al—Si eutectic solidifies between the highly aluminum doped layer and the silicon enriched layer. The highly aluminum-doped epitactically grown silicon layer is responsible for the passivation of the back surface of the solar cell. As a result of the high Al doping, a surplus of negatively charged, immovable Al acceptors is created, which produce an electric field that repels the minority carriers, the so-called back-surface field.

When the aluminum layer extends over the entire back surface of the solar cell and/or substrate, there is a soldering problem because it is not easy to directly solder tin-plated or non tin-plated metal connectors, for example, in particular copper connectors onto the aluminum back surface. In order to still carry out the required electric contacting, conductor paths having silver contacts or soldering points are directly applied onto the substrate surface by means of a screen printing, pad printing or other suitable printing process, and the tin-plated copper strips soldered onto them. Consequently, a recess in the aluminum layer is provided in the area of the soldering contacts resulting in that no back-surface field may form in this area so that the back surface of the solar cell is not completely passivated electrically and therefore less local photo currents appear. This has a negative impact on the degree of efficiency.

Since silver as a raw material is expensive, it should be dispensed with in order to reduce the manufacturing costs. Therefore, it is desirable to fully avoid the Ag contact.

Soldering the contact strips directly onto the aluminum layer is hardly possible for several reasons. One of the reasons is the oxidized surface of the Al particles. A further reason is that as a result of the sintering process, the upper aluminum surface is not sufficiently cohesive. Thus, during the sintering process an aluminum layer in the form of isolated spherical Al particles sintered together (sintered layer) originates over the silicon-doped alloy layer, where the aluminum bond is not a compact bond, but a rather loose sintered bond, which, depending on the composition of the aluminum paste and/or processing values during sintering is more or less porous. The pores may be filled with glass components.

If despite that, it should be possible to solder on this sintered aluminum layer, the hold would be very poor because of the porosity and consequent instability of the layer. This poor hold is noticeable as low pull-off forces of approx. 2-8 N, the sintered layer being torn apart so that the sphere structure of the particles may be recognized on both sides of the tear-off points. This entails the risk that the sintered layer may be destroyed on attempting to pull off the contact strips. The same occurs when the soldering connection on the aluminum layer is exposed to the pull-off forces actuating under operating conditions in a module. Small tears may result, which may lead to less durability of the soldering point and consequently also entail higher transfer resistance.

SUMMARY OF THE INVENTION

The object of the present invention is to further develop a semiconductor component and/or a method for producing a metal-semiconductor contact of the type described above such that a mechanically durable, electrically flawless contact that may be soldered in the area of the material of the second layer, which in particular consists of aluminum or contains aluminum, is produced, and where the back-surface field relevant to passivation is not interrupted or damaged.

According to the present invention, the object is attained by a means of a semiconductor component of the above described type such that the electroconductive contact comprises a solderable or wettable metallic material, which is alloyed into the second layer or forms a mixture with the material of the second layer. The solderable or wettable metallic material that originates in the second layer is preferably alloyed into at least one of the two intermediate layers. A wettable metallic material is a contact material which is wetted by the respectively used molten solder with which the connector is soldered on and/or onto.

According to the present invention, a semiconductor component results, whose back surface is totally or at least in part covered by the second layer, which consists of basic contact material, in particular aluminum or at least containing the basic contact material, such as aluminum, in the area of the soldering point, said second layer being alloyed with the semiconductor material, resulting in a back surface of the semiconductor component that is passivated over its entire area by means of a back-surface field. The layer forming the back-surface field is the second intermediate layer.

A layer containing a solder material, such as a Sn layer, may then be applied onto the second layer in order to be alloyed into it by means of a suitable method such that a continuous electric contact reaching the first layer is created. Via this contact it is possible to solder a connector, such as a copper connector, onto the back surface.

The first intermediate layer is the layer that is doped with the semiconductor material made of basic contact material, such as aluminum and/or additionally of the solder material. This may comprise Sn, SnAg, PbSn, CdSn, SnZn, SnMg, SnBa and/or SnCa and/or comprise one or more of these materials. In this case, the first intermediate layer may also comprise a eutectic consisting of the materials of the first and second layers.

The solder wettable metallic material may, if necessary, be alloyed into the semiconductor component to an extent such that the wettable metallic material is alloyed extending into the second intermediate layer forming the back-surface field doped with basic contact material as an edge layer of the first layer. As the respective second intermediate layer is formed from the first layer, alloying consequently takes place up to the edge of the semiconductor material, but not affecting the function of the back-surface field. The solder wettable metallic material may also reach up to the semiconductor material, i.e. it may even be alloyed into the edge layer doped with the basic contact material.

The second layer is at least one material selected from the group consisting of Al, In, Ga, B group and mixtures thereof.

The wettable metallic material of the electroconductive contact is at least one material selected from the group consisting of Sn, Pb, Zn, Mg, Ca, Ba, In, Ga, Cd, Ag, Au, Ni, Fe and mixtures thereof, or another suitable solder material.

The second layer may also comprise a material which is made of the basic contact material, such as Al, and the solderable material.

The proportion of the material admixed with the second layer may be from 0.01% by weight to 99.9% by weight. However, preferably proportions ranging between 10% by weight and 30% by weight and/or 50% by weight and 70% by weight are provided.

According to the present invention, a continuous electric contact originating at the first layer passing through the second layer results, onto which a connector, such as a copper connector, may be soldered onto the second layer. This electric contact, which preferably is a Sn solder or at least a comprises a Sn containing solder, fills the pores of the second layer, such as an aluminum sintered layer, and forms a cohesive metal layer. By means of these measures, the porosity of the sintered layer that was accentuated during the sintering process and is responsible for the poor mechanical stability and poor electric contact properties, is at least eliminated locally, and namely there, where the solder is located.

Alternatively, the second layer, like the aluminum layer, may be made solderable in that adequate amounts of a Sn powder or Sn—Al alloy powder, for example, are admixed with the paste, such as aluminum paste, consisting of the basis material of the second layer, as a result of which an electric contact may be produced that originates at the first layer consisting of semiconductor material as a substrate and that passes through the second layer as an aluminum back-contact layer, onto which a copper connector may be soldered.

An electric metallic contact is created, which at least reaches up to the layer that is doped with semiconductor material establishing a mechanically adhesive connection to it, without affecting the electric properties of the back-surface field.

A method for producing a metal-semiconductor contact of the type described above is characterized in that after forming the second layer, a solderable or wettable metallic material is applied onto it, or that for forming the second layer, a mixture made of the basic contact material and of a solderable material is applied onto the first layer, and that by means of mechanical and/or thermal treatment and/or thermal spraying a solderable or wettable metallic material is alloyed into the second layer or into the second layer and into at least one intermediate layer that forms between the first and second layer during the production of the semiconductor component.

A possible production method is characterized in that the solderable material is alloyed by means of mechanical or acousto-mechanical processing, like rubbing or hammering, or sound or ultrasound application to the semiconductor component with simultaneous thermal treatment into the second layer and/or extending into the at least one intermediate layer and/or first layer during and/or after formation of the second layer. In this case, the ultrasound may be applied at a frequency f of 10 kHz≤f≤100 kHz, in particular 20 kHz≤f≤80 kHz. It may particularly be provided that the semiconductor component to be produced is exposed to a temperature of 0° C.≤T≤800° C., in particular 180° C.≤T≤350° C.

A further possibility provides that the solderable material is alloyed exclusively or essentially exclusively by means of thermal treatment of the semiconductor component to be produced into the second layer and, if necessary, at least first intermediate layer during or after formation of the second layer. In this case, the thermal treatment should be performed at temperatures ranging between 150° C. and 1,600° C. (local, short-term), preferably ranging between 230° C. and 450° C.

In the case of very high temperatures, the heat input is provided by a laser beam or an intensive light source (ZMR). The light source is focused on the areas to be soldered by means of an elliptical mirror and subsequently guided over the areas to be soldered. Alternatively, light pulses may be applied to the areas to be soldered. Finally, a laser beam may also be rastered over the areas to be soldered. A further possibility for heating the areas to be soldered is the injection of a mid frequency or high frequency electromagnetic field (induction soldering). For this purpose, frequencies ranging between 10 kHz to 10 MHz, preferably 100 to 800 kHz, are provided.

If the solderable material is applied by means of thermal spraying, as a result of which alloying preferably extending into at least the first intermediate layer takes place simultaneously, the solderable material should be applied at a speed V of 10 m/s≤V≤1000 m/s, preferably V 300 m/s. During spraying, the semiconductor component to be produced should further be exposed to a temperature ranging between 100° C. and 600° C.

During thermal spraying, the semiconductor component may also be treated with ultrasound at a frequency of particularly 10 kHz≤f≤100 kHz, preferably of 20 kHz≤f≤80 kHz.

Alternatively, a mixture made of the basic contact material of the second layer, such as aluminum paste and wettable metallic or solderable material, or an alloy containing the solderable material, may be applied onto the first layer in order to subsequently form a second layer. As a mixture, in particular such a mixture is used which contains x % by weight of wettable metallic and/or solderable material and/or an alloy containing the solderable material, where 0% by weight<x≤50% by weight or 50% by weight≤x<100% by weight.

However, by means of selective temperature application to the second layer, the wettable metallic and/or solderable material may also be alloyed by soldering extending preferably into at least the first intermediate layer.

As a basic contact material for the second layer, such material is used that at least is or contains a material selected from the group consisting of Al, In, Ga, B and mixtures thereof.

As a wettable metallic or solderable material—such as also metal and ceramic material, for example—such material is used that is or contains a material selected from the group consisting of tin, tin alloy, indium, lead, cadmium, gallium, silver, gold, nickel, iron, titanium, hafnium, zinc, magnesium, calcium, barium and mixtures thereof.

Furthermore, another wettable metallic material may either be applied completely or at least in part onto the large-area aluminum contact. A sputtered approx. 80 mm thick Ni:V layer should be regarded as an example of a solderable layer structure applied onto a large area.

Al and Cu or Ag and Cu should be mentioned as examples of materials applied as a layer onto partial areas. The possible metals are Ag, Cu, Al, Ni, Zn.

BRIEF DESCRIPTION OF THE DRAWINGS

Further details, advantages and characteristics of the present invention are not only apparent from the claims, the features described therein—as such and/or combined—, but also from the exemplary embodiments apparent from the following description of the drawings.

The drawings show.

DESCRIPTION OF THE PREFERRED EMBODIMENTS

From the figures, a purely schematic section view of a semiconductor component is apparent, which for the sake of simplification will be designated as solar cell. In this case a substrate 10 consisting of silicon is shown, i.e. a layer of semiconductor material—hereinafter also designated as semiconductor layer—, on whose front surface semiconducting layers for the formation of a p-n transition as well as front contacts and, if necessary, passivation layers may be applied in the customary manner. In this respect, reference is made to sufficiently known constructions and/or designs of semiconductor components, like solar cells, without requiring detailed explanations.

Figure 1:
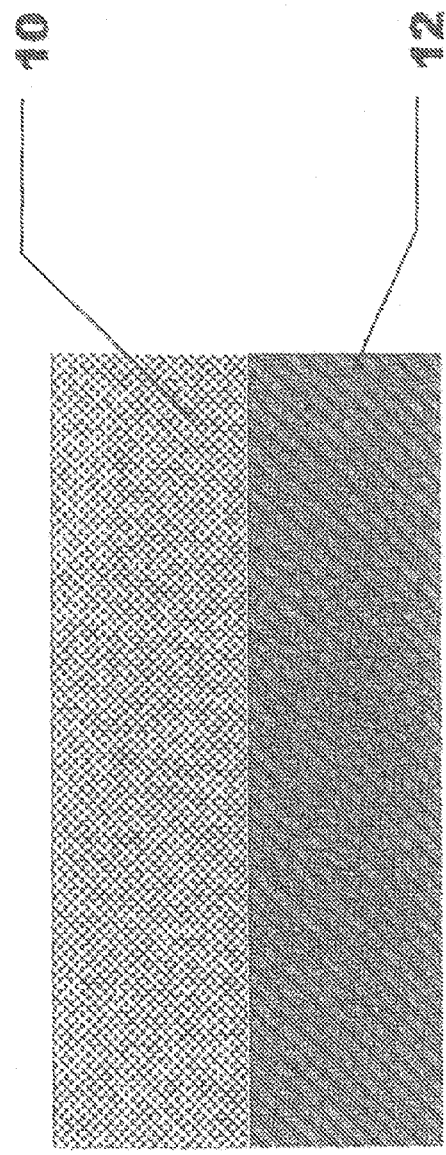
FIG. 1 a schematic diagram of a section view of a prior art semiconductor system consisting of a first semiconductor layer and a second layer made of basic contact material, FIG. 2 a schematic configuration of the prior art semiconductor component according to FIG. 1 with accomplished contact between the semiconductor layer and the basic contact material, FIG. 3 the semiconductor component according to FIG. 2 with applied solderable material, FIG. 4 the semiconductor component according to FIG. 2 with a differently far reaching semiconductor-metal contact according to the invention, and FIG. 5 the semiconductor component according to FIG. 2 with a semiconductor-metal contact according to the invention, reaching up to a first intermediate layer, as well as a semiconductor-metal contact according to the invention alloyed only into the second layer.
Figure 2:
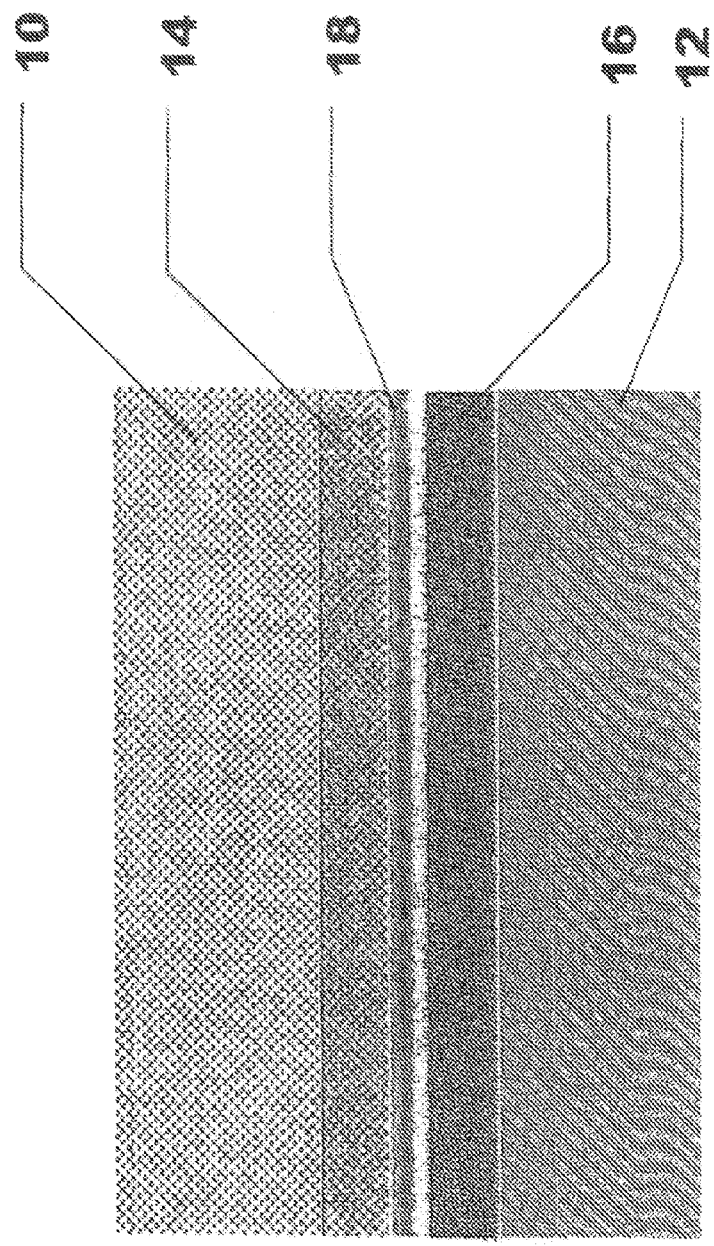

As shown in FIG. 1, layer made of a metallic and/or semimetallic material—hereinafter by way of example designated as aluminum for all possible materials—is applied onto the semiconductor layer 10 designated as the first layer by means of screen printing, pad printing, thermal spraying, which is exposed to a sintering process during the production of the solar cell, as a result of which an external aluminum sinter layer 12 is created as a second layer. As shown in FIG. 2, the aluminum sinter layer 12 and the silicon substrate 10 an aluminum doped silicon layer 14 and a silicon doped aluminum layer 16 with an Al—Si eutectic 18 that form the back-surface field are created during production. In this respect, reference is likewise made to the sufficiently known state of the art. The silicon doped aluminum layer 16 is designated as the first intermediate layer and the aluminum doped silicon layer is designated as the second intermediate layer 14.

The external or second layer 12 consisting of aluminum is porous as a result of the sintering process, and consequently has a large number of cavities.

Regarding the layers 10, 12 and the intermediate layers 14, 16 including the eutectic 18, it should be noted that they are shown purely schematically, without reproducing the actual dimensions.

Figure 3:
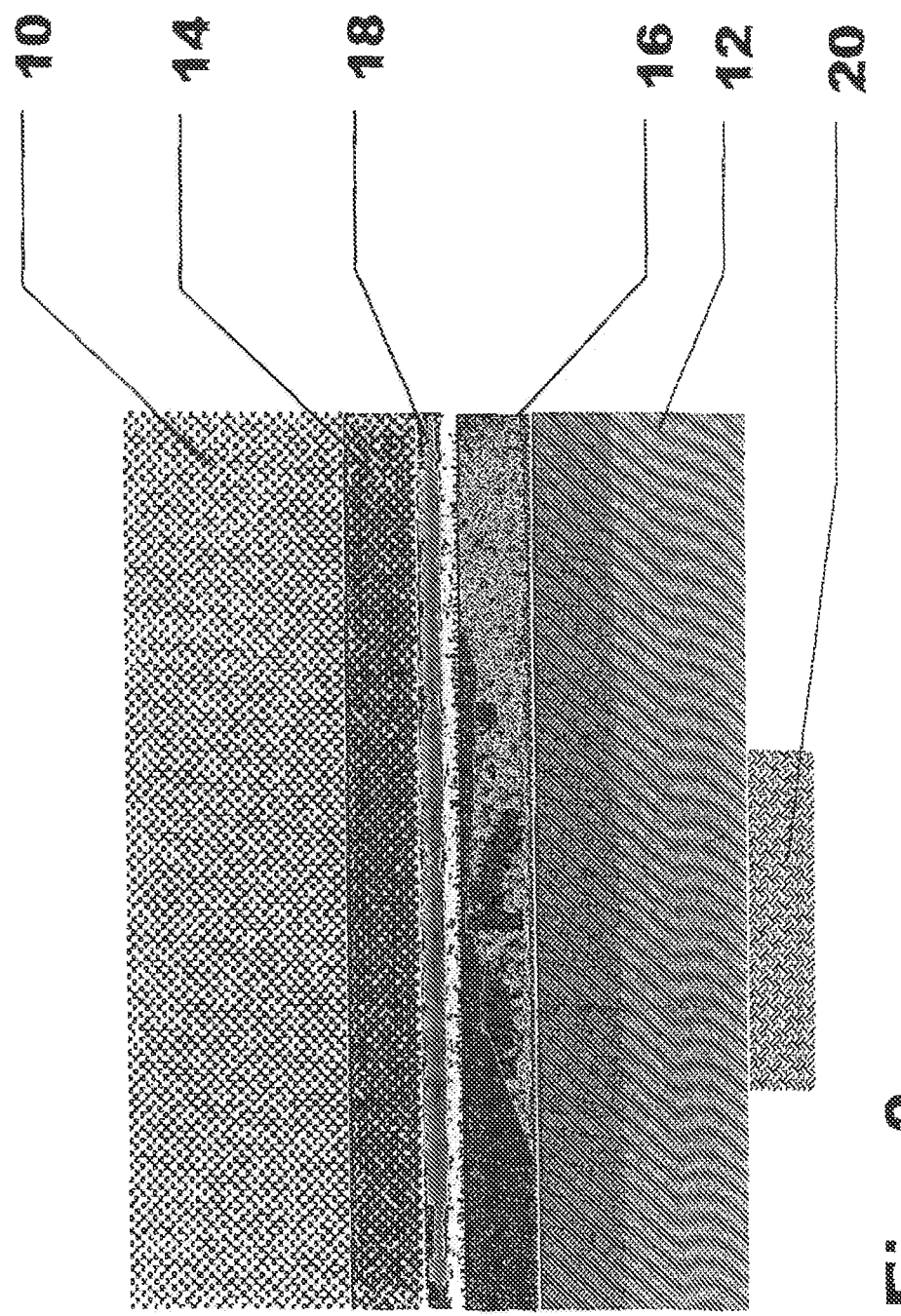

In order to be able to solder a connector, such as a copper connector, for contacting onto the aluminum sinter layer 12 designated as the second layer, according to the graphic illustration of FIG. 3, a layer 20 consisting of a wettable metallic and/or containing a solderable material or made of such material is applied onto the entire area or to partial areas of the second layer 12. This should merely be understood by way of example, since—as will be explained hereinafter—there are other possibilities of introducing solderable material into layers such that a solderable contact results.

As already mentioned, it is graphically provided that the layer 20 containing Sn or consisting of Sn or containing a Sn alloy is preferably applied onto the second layer 12, namely the sinter layer, in order to afterward diffuse the solderable material from the layer 20 into at least the edge of the back-surface field forming and aluminum-doped Si edge layer as the second intermediate layer 14 by selectively applying heat by soldering, for example. This is shown crosshatched in FIG. 4. A connector, such as a copper connector, may then be soldered onto the corresponding area designated with the reference numeral 15 so that the required electric interconnection of the semiconductor component is enabled, irrespective of the fact that on its merits the back surface cannot be soldered onto the second layer 12, like the aluminum sinter layer. The area 15 is the electroconductive contact.

There are different possibilities of configuring the semiconductor-metal contact which will be explained schematically hereinafter.

By applying acousto-mechanical vibrations and heat to a system consisting of the semiconductor layer, such as a Si layer, as the first layer 10, the second layer 12 made of the basic contact material such as aluminum, indium, gallium, boron or a mixture thereof and the intermediate layers 14, 16, 18 running between them, the solderable material 20 applied onto the second layer 12 is alloyed into the edge of the aluminum-doped silicon layer 14, which forms the back-surface field. Alternatively, the solderable material may already be present in the second layer 12. The required vibration is produced with ultrasound, applying frequencies of between 10 kHz and 100 kHz, preferably of between 20 kHz and 80 kHz. While the solderable material is alloyed, the semiconductor component should be heated to the desired temperature, which may range between 0° C. and 600° C., preferably between room temperature and 300° C.

Alternatively, only thermal treatment may be carried out for diffusing the solderable material, the applied temperatures being above the melting temperature of the solderable material. The preferred temperatures range between 230° C. and 900° C., in particular between 350° C. and 400° C., namely depending on the solderable material, which may particularly be tin, indium, lead, gallium, cadmium, silver, gold, nickel, iron, titanium, hafnium, zinc, magnesium, calcium, barium, or a mixture formed thereof. The material to be soldered and alloyed may preferentially be applied after the sinter layer 12 is formed.

However, it is also possible to use a starting material and/or paste already containing the solderable material for producing the sinter layer 12. In this case, through thermal treatment, such as the sintering process at temperatures ranging from 700° C. to 1000° C. a mixture of the basic contact material of the second layer 12 and the solderable material in the layer 12 results, which is alloyed into the at least first intermediate layer 16, i.e. alloyed into the silicon doped aluminum layer as shown in the exemplary embodiment (area 15 in FIG. 5). Further alloying extending to the edge of the layer 14 that forms the back-surface field may be carried out (area 15 in FIG. 4).

A further possibility of bringing the solderable material into the at least first intermediate layer and/or into the second intermediate layer 14 is the application of the solderable material onto the sintered aluminum layer 12 by means of thermal spraying. Additionally, ultrasound may be applied and/or a thermal treatment be carried out. If the vibrations are induced in the semiconductor component for diffusing the solderable material, the ultrasound should be applied at frequencies between 10 kHz and 100 kHz, preferably between 20 kHz and 80 kHz. The solderable material as such should impact at a velocity between 10 m/s and 1000 m/s, preferably in the range of 300 m/s.

As already explained above, the semiconductor-metal contact may also be produced by means of customary soldering methods. For this purpose, a paste made of basic contact material for the back-contact with parts of solderable material, like Sn or a Sn—Al alloy is applied during the production of the semiconductor component. When the semiconductor component and/or solar cell is produced, i.e. on formation of the back-contact at the aluminum-silicon boundary layer, i.e. in the transition area between the layers 14 and 16, a cohesive Al—Sn layer is already formed, which extends to the external back surface as an Al—Sn layer.

If an aluminum paste with Sn components is used, its Sn portion may range between 0 at. %<x<50 at. %. Owing to the extremely low solubility of Sn in silicon, which (in the Si—Sn binary phase diagram) at 700° C. is 0.05 at. % and at 900° C. is 0.08 at. %, the Al portion persists during the alloy phase on formation of the back contact so that the Al—Si alloy phase and the highly aluminum doped epitactically grown Si layer 14 that is responsible for the back-surface field at the back surface may grow undisturbed in the presence of Sn. As Sn is isoelectronic with respect to Si, this does not cause significant changes in the electric properties of the back contact. Hence the conventional processing values may be maintained so that consequently no changes in the technology are required.

However, it is also possible that the aluminum paste contains Sn components in the range between 50 at. % and less than 100 at. %. With the respective composition the entire back-surface metallization already melts at low temperatures in the range between 230° C. and 580° C. so that an aluminum containing Al—Si boundary layer is created. Owing to the low solubility of Sn in Si, the above explanations are applicable.

The difference between the above described method for producing the contacts by using pastes with different Sn components is that with a Sn portion of ≤50% the alloy formation between Al and Si only melts up to a certain degree, whereas with a higher Sn portion (50% to less than 100%), the back-contact layer turns completely liquid through the Al—Sn alloy formation.

Hereof the Sn portion of the layer at least reaches through to the Al—Si—Sn alloy layer 16, as is schematically indicated in FIG. 5.

A further method for configuring the semiconductor-metal contact is that on soldering solderable material onto the back surface of the semiconductor material, alloying takes place. In this case, the second layer likewise has a correspondingly solderable material featuring a given adjustment. In this case, it will hereinafter be assumed that the basic material of the second layer 12 is aluminum and that the solderable material is Sn. If Sn solder is soldered on from the back surface, local enrichment of the Al—Sn alloy with Sn, and consequently a different composition of the Al layer depending on the available amount of Sn result. The penetration depth of the solder alloy/solder zone is defined by the limited soldering temperature. At a soldering temperature of 250° C., 2 at. % aluminum is dissolved. However, as the Sn content of the metal back-contact surface 12 has been adjusted in a definite manner according to the equilibrium temperature, this layer reaches to the boundary layer of the alloy layer 16. Soldering penetrates into the metal layer, where the concentration is modified as the Al content increases strongly. If the Sn portion becomes too high, the melting zone may run through. Thus, the solder effect may be reinforced in that the metal contact layer 12 is enriched with Sn. The penetration depth may be adjusted at a predefined temperature by means of an adequate composition of the Al—Sn alloy.

While the alloy layer is formed in the contact during the sintering phase, Al and Sn bond together to form a cohesive layer, which is porous in a composition with a portion of less than 50% by weight based on Sn and compact in a composition, if the Sn portion is greater than 50% by weight. As a result of this, soldering on Sn containing particles or partial areas of the alloy layer may be performed. If the Sn content is increased, the soldering temperature may be reduced.

Figure 4:
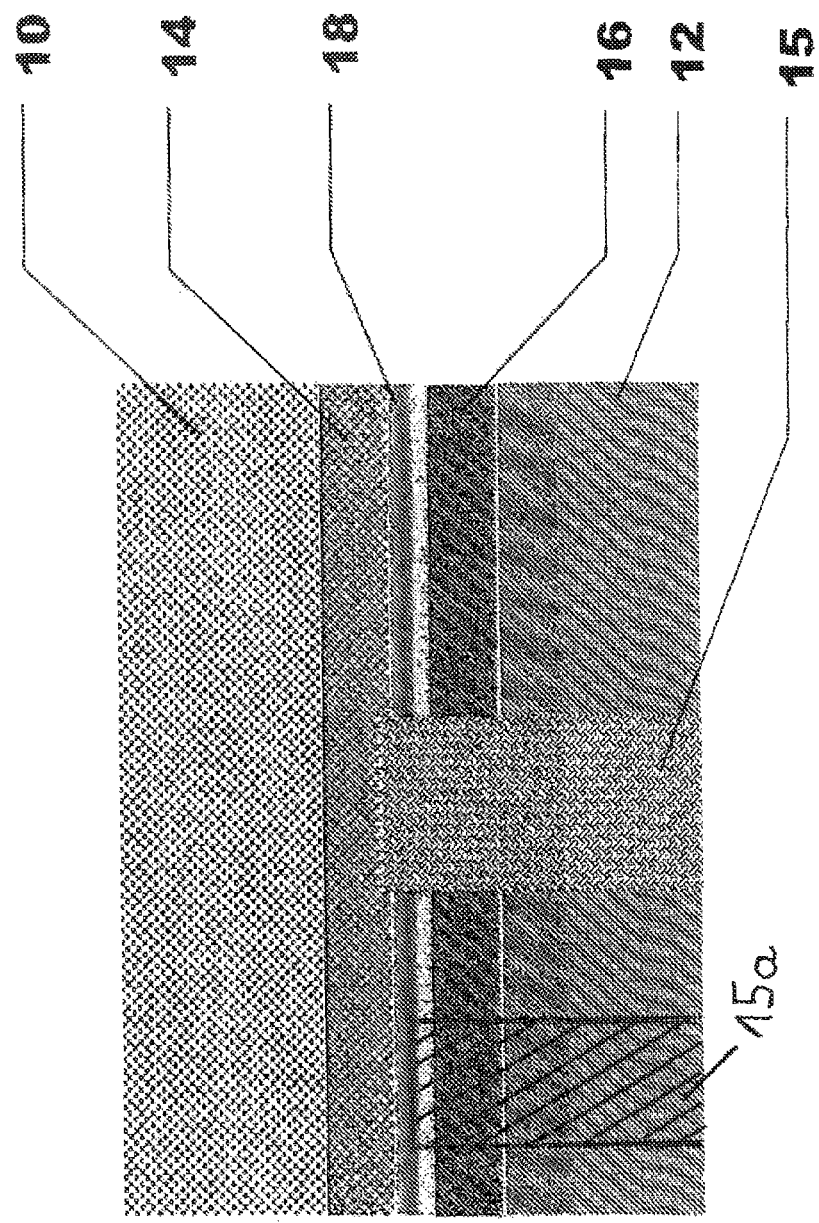

The electroconductive contact 15 originating at the external surface of the second layer 12 is designated with reference numeral 15 in FIG. 4, which extends into the second intermediate layer 14, i.e. into the aluminum-doped silicon layer that forms the back-surface field. In FIG. 5, the electroconductive contact runs from the sinter layer, i.e. the second layer 12, to the first intermediate layer 16, which is the silicon-doped aluminum layer. However, it is also possible that the electric contact extends to the Al—Si eutectic 18, like the area illustrated in FIG. 4 and provided with the reference numeral 15a.

A further possibility is that the electric contact is only alloyed into the second layer 12, like the area illustrated in FIG. 5 and designated with the reference numeral 15b.

What is claimed is:

1. A semiconductor component comprising:
    a first layer comprising a semiconductor material substrate;
    a second layer comprising a second material;
    two intermediate layers disposed between the first and second layers, and comprising the materials of the first and second layers, a first of said intermediate layers facing the second layer, and comprising a eutectic mixture of the materials of the first and second layers; and
    an electroconductive contact forming an electroconductive connection to the first layer and extending at least from an outer surface of the second layer into the second layer,
    the electroconductive contact originating from the outer surface of said second layer, and comprising a solderable or wettable metallic material, which is alloyed into the second layer and the first intermediate layer, or which forms a mixture with the material of the second layer and the first intermediate layer, and a connector soldered onto said solderable or wettable material;
    wherein the solderable or wettable metallic material comprises at least one material selected from the group consisting of Sn, Pb, In, Ga, Cd, Fe, Au, Ti, Hf, Zn, and Mg; and
    wherein the solderable or wettable metallic material additionally comprises at least one of Ca and Ba.

2. The semiconductor component according to claim 1, wherein the solderable or wettable metallic material extends through or is alloyed into a second of said intermediate layers.

3. The semiconductor component according to claim 1, wherein the second intermediate layer is doped with the material of the second layer, and runs between the first layer and the first intermediate layer adjacent to the second layer, extending to the electroconductive contact containing the solderable or wettable metallic material.

4. The semiconductor component according to claim 1, wherein the second layer comprises at least one basic contact material selected from the group consisting of Al, In, and Ga.

5. The semiconductor component according to claim 4, wherein the second layer additionally comprises B.

6. The semiconductor component according to claim 1, wherein the second layer comprises a mixture of Al and the solderable or wettable metallic material.

7. The semiconductor component according to claim 1, wherein the second layer comprises a material which is produced with a mixture of Al and the solderable or wettable metallic material.

8. The semiconductor component according to claim 1, wherein after the formation of the second layer, the solderable or wettable metallic material is alloyed into the second layer.

9. The semiconductor component according to claim 1, wherein the solderable or wettable metallic material is alloyed into the second intermediate layer, forming a back-surface field and comprising the semiconductor material alloyed with the material of the second layer.

10. The semiconductor component according to claim 1, wherein the material of the second layer and the solderable or wettable metallic material are dissolved in the second intermediate layer.

11. The semiconductor component according to claim 1, wherein the second layer contains from 0.01% by weight to 99.9% by weight of the solderable or wettable metallic material.

12. The semiconductor component according to claim 11, wherein the second layer contains from 10% by weight to 50% by weight of the solderable or wettable metallic material.

13. A semiconductor component comprising:
a first layer comprising a semiconductor material substrate;
a second layer comprising a second material;
two intermediate layers disposed between the first and second layers, and comprising the materials of the first and second layers, a first of said intermediate layers facing the second layer, and comprising a eutectic mixture of the materials of the first and second layers; and
an electroconductive contact forming an electroconductive connection to the first layer and extending at least from an outer surface of the second layer into the second layer, the electroconductive contact originating from the outer surface of said second layer, and comprising a solderable or wettable metallic material, which is alloyed into the second layer and the first intermediate layer, or which forms a mixture with the material of the second layer and the first intermediate layer, and a connector soldered onto said solderable or wettable material; and
wherein the solderable or wettable metallic material consists of tin.

14. The semiconductor component according to claim 13, wherein the solderable or wettable metallic material extends through or is alloyed into a second of said intermediate layers.

15. The semiconductor component according to claim 13, wherein the second intermediate layer is doped with the material of the second layer, and runs between the first layer and the first intermediate layer adjacent to the second layer, extending to the electroconductive contact containing the solderable or wettable metallic material.

16. The semiconductor component according to claim 13, wherein the second layer comprises at least one basic contact material selected from the group consisting of Al, In, and Ga.

17. The semiconductor component according to claim 13, wherein the second layer comprises a mixture of Al and the solderable or wettable metallic material.

18. The semiconductor component according to claim 13, wherein the second layer comprises a material which is produced with a mixture of Al and the solderable or wettable metallic material.

19. The semiconductor component according to claim 13, wherein after the formation of the second layer, the solderable or wettable metallic material is alloyed into the second layer.

20. The semiconductor component according to claim 13, wherein the solderable or wettable metallic material is alloyed into the second intermediate layer, forming a back-surface field and comprising the semiconductor material alloyed with the material of the second layer.

21. The semiconductor component according to claim 13, wherein the material of the second layer and the solderable or wettable metallic material are dissolved in the second intermediate layer.

22. The semiconductor component according to claim 13, wherein the second layer contains from 0.01% by weight to 99.9% by weight of the solderable or wettable metallic material.

23. The semiconductor component according to claim 22, wherein the second layer contains from 10% by weight to 50% by weight of the solderable or wettable metallic material.

24. A method for producing a metal semiconductor contact of a semiconductor component, comprising:
a first layer comprising a semiconductor material substrate;
a second layer comprising a second material;
two intermediate layers disposed between the first and second layers, and comprising the materials of the first and second layers, a first said intermediate layer facing the second layer; and
an electroconductive contact forming an electroconductive connection to the first layer and extending at least from an outer surface of the second layer into the second layer, the electroconductive contact comprising a solderable or wettable metallic material, which is alloyed into the second layer and the first intermediate layer, or forms a mixture with the material of the second layer and the first intermediate layer,
wherein the solderable or wettable metallic material comprises at least one material selected from the group consisting of Sn, Pb, In, Ga, Cd, Fe, Au, Ti, Hf, Zn, and Mg; and
wherein the solderable or wettable metallic material additionally comprises at least one of Ca and Ba;
said method comprising the steps of:
forming on the second layer the solderable or wettable metallic material, or forming the second layer from a mixture containing the solderable or wettable metallic material,
performing at least one of a mechanical treatment, a thermal treatment and thermal spraying, thereby alloying or mixing the solderable or wettable metallic material into the second layer and at least into one of the intermediate layers, and
attaching the first and second layers with the intermediate layers therebetween, before or after said forming step.

25. The method according to claim 24, wherein the solderable or wettable metallic material is exclusively or essentially exclusively alloyed into the second layer or into the second layer and into the at least one intermediate layer by means of thermal treatment of the semiconductor component being produced during and/or after formation of the second layer.

26. The method according to claim 24, wherein the mechanical treatment is an acousto-mechanical treatment.

27. The method according to claim 24, wherein the thermal treatment is performed at a temperature T of 150° C.≤T≤800° C.

28. The method according to claim 24, wherein the mechanical treatment comprises ultrasound application to the semiconductor component being produced.

29. The method according to claim 28, wherein the ultrasound is applied at a frequency f of 10 kHz≤f≤100 kHz.

30. The method according to claim 28, wherein during the ultrasound application, the semiconductor component being produced is exposed to a temperature T of 0° C.≤T≤1,000° C.

31. The method according to claim 24, wherein the solderable material is applied onto the second layer by thermal spraying.

32. The method according to claim 31, wherein the solderable material is applied at a velocity v of 10 m/s≤v≤3000 m/s.

33. The method according to claim 31, wherein during thermal spraying, the semiconductor component being produced is exposed to a temperature T of 0° C.≤T≤500° C.

34. The method according to claim 31, wherein the during thermal spraying, the semiconductor component being produced is treated with ultrasound at a frequency f of 10 kHz≤f≤100 kHz.

35. The method according to claim 24, wherein the second layer is formed by forming a mixture of a second material and the solderable material, or by applying an alloy containing the solderable material onto the first layer, and forming the second layer thereafter.

36. The method according to claim 35, wherein the mixture contains a portion x of solderable material, or the alloy contains a portion x of the solderable material, wherein 0% by weight <x≤50% by weight or 50% by weight ≤x<100% by weight.

37. The method according to claim 24, wherein the solderable material is alloyed by soldering up to at least one intermediate layer by means of selective temperature application to the second layer.

38. The method according to claim 24, wherein the second layer material is selected from the group consisting of Al, In, Ga, B and mixtures thereof.

39. The method according to claim 24, wherein the solderable or wettable metallic material is an Sn alloy or a material containing an Sn alloy.

40. The method according to claim 24, wherein between the first layer and the second layer are formed:
   a first intermediate layer, which is the material of the second layer alloyed with the material of the first layer,
   a second intermediate layer, which is the material of the first layer that is alloyed with the material of the second layer, and
   a eutectic layer that runs between the first intermediate layer and the second intermediate layer.

41. A method for producing a metal semiconductor contact of a semiconductor component, comprising:
   a first layer comprising a semiconductor material substrate;
   a second layer comprising a second material;
   two intermediate layers disposed between the first and second layers, and comprising the materials of the first and second layers, a first said intermediate layer facing the second layer; and
   an electroconductive contact forming an electroconductive connection to the first layer and extending at least from an outer surface of the second layer into the second layer,
   the electroconductive contact comprising a solderable or wettable metallic material, which is alloyed into the second layer and the first intermediate layer, or forms a mixture with the material of the second layer and the first intermediate layer,
   wherein the solderable or wettable metallic material consists of tin;
   said method comprising the steps of:
   forming on the second layer the solderable or wettable metallic material, or forming the second layer from a mixture containing the solderable or wettable metallic material,
   performing at least one of a mechanical treatment, a thermal treatment and thermal spraying, thereby alloying or mixing the solderable or wettable metallic material into the second layer and at least into one of the intermediate layers, and
   attaching the first and second layers with the intermediate layers therebetween, before or after said forming step.

42. The method according to claim 41, wherein the solderable or wettable metallic material is exclusively or essentially exclusively alloyed into the second layer or into the second layer and into the at least one intermediate layer by means of thermal treatment of the semiconductor component being produced during and/or after formation of the second layer.

43. The method according to claim 41, wherein the mechanical treatment is an acousto-mechanical treatment.

44. The method according to claim 41, wherein the thermal treatment is performed at a temperature T 150° C.≤T≤800° C.

45. The method according to claim 41, wherein the mechanical treatment comprises ultrasound application to the semiconductor component being produced.

46. The method according to claim 41, wherein during the ultrasound application, the semiconductor component being produced is exposed to a temperature T of 0° C.≤T≤1,000° C.

47. The method according to claim 45, wherein the ultrasound is applied at a frequency f of 10 kHz≤f≤100 kHz.

48. The method according to claim 41, wherein the solderable material is applied onto the second layer by thermal spraying.

49. The method according to claim 41, wherein the solderable material is applied at a velocity v of 10 m/s≤v≤3000 m/s.

50. The method according to claim 48, wherein during thermal spraying, the semiconductor component being produced is exposed to a temperature T of 0° C.≤T≤500° C.

51. The method according to claim 48, wherein the during thermal spraying, the semiconductor component being produced is treated with ultrasound at a frequency f of 10 kHz≤f≤100 kHz.

52. The method according to claim 41, wherein the second layer is formed by forming a mixture of a second material and the solderable material, or by applying an alloy containing the solderable material onto the first layer, and forming the second layer thereafter.

53. The method according to claim 52, wherein the mixture contains a portion x of solderable material, or the alloy contains a portion x of the solderable material, wherein 0% by weight <x≤50% by weight or 50% by weight≤x<100% by weight.

54. The method according to claim 41, wherein the solderable material is alloyed by soldering up to at least one intermediate layer by means of selective temperature application to the second layer.

55. The method according to claim 41, wherein the second layer material is selected from the group consisting of Al, In, Ga, B and mixtures thereof.

56. The method according to claim 41, wherein between the first layer and the second layer are formed:
- a first intermediate layer, which is the material of the second layer alloyed with the material of the first layer,
- a second intermediate layer, which is the material of the first layer that is alloyed with the material of the second layer, and
- a eutectic layer that runs between the first intermediate layer and the second intermediate layer.

\* \* \* \* \*